United States Patent [19]

Nagasawa

[11] Patent Number: 5,295,093
[45] Date of Patent: Mar. 15, 1994

[54] POLARITY-CONVERTIBLE JOSEPHSON DRIVER CIRCUIT

[75] Inventor: Shuichi Nagasawa, Tokyo, Japan
[73] Assignee: NEC Corporation, Tokyo, Japan
[21] Appl. No.: 2,897
[22] Filed: Jan. 11, 1993
[30] Foreign Application Priority Data
  Jan. 10, 1992 [JP] Japan .................................. 4-3259
  Jan. 10, 1992 [JP] Japan .................................. 4-3275
[51] Int. Cl.$^5$ ........................................... G11C 11/44
[52] U.S. Cl. .................... 365/162; 307/306; 307/476
[58] Field of Search ............... 365/161, 162; 307/306, 307/462, 476

[56] References Cited

U.S. PATENT DOCUMENTS 4,482,821 11/1984 Houkawa et al. ............. 307/306 X
4,916,335 4/1990 Goto et al. ..................... 307/306

OTHER PUBLICATIONS

S. Tahara et al., "Wide-Margin Polarity-Convertible Josephson Drivers" by Electronics Letters, Sep. 15, 1988, vol. 24 No. 19 pp. 1220–1221.
S. Tahara et al., "the Spring National Convention of the Institute of Electronics and Communication Engineers of Japan, 1988, C-66, Polarity-Convertible Driver Circuits" by Jpn. J. Appl. Phys., vol. 26, No. 9, 1987, p. 1463.

Primary Examiner—Eugene R. LaRoche
Assistant Examiner—Christopher R. Glembocki
Attorney, Agent, or Firm—Sughrue, Mion, Zinn, Macpeak & Seas

[57] ABSTRACT

A polarity-convertible Josephson driver circuit includes first and second driving voltage generating circuits, a driven line, and a load resistor. Each of the first and second driving voltage generating circuits has a loop circuit for forming at least one loop, the loop circuit being constituted by inductances and Josephson junctions so that a plurality of series-connected circuits each constituted by the inductances and the Josephson junctions are parallelly connected between an output point and a reference point, and a control line which has one terminal connected to an input point and the other terminal connected to the output point and is arranged to magnetically coupled to the loop circuit. The driven line connects the output points of the first and second driving voltage generating circuits to each other. A load resistor is inserted in the driven line.

6 Claims, 9 Drawing Sheets

POLARITY-CONVERTIBLE JOSEPHSON DRIVER CIRCUIT

BACKGROUND OF THE INVENTION

The present invention relates to a superconducting integrated circuit using Josephson junctions and, more particularly, to a polarity-convertible Josephson driver circuit capable of injecting a current into a driven line such as a word or bit line of the memory cell array of the superconducting memory integrated circuit and arbitrarily reversing the direction of the current.

FIG. 9 shows an equivalent circuit for explaining a conventionally known polarity-convertible Josephson driver circuit (the Spring National Convention of the Institute of Electronics and Communication Engineers of Japan, 1988, C-66, "Polarity-Convertible Driver Circuits"). This prior art will be described below with reference to FIG. 9.

As shown in FIG. 9, a conventional polarity-convertible Josephson driver circuit comprises four magnetic coupling Josephson gate circuits $G_1$, $G_2$, $G_3$, and $G_4$, three resistors $R_1$, $R_2$, and $R_L$, and a driven line L. In a memory circuit, the driven line L corresponds to the word or bit line of a memory cell array.

In this driver circuit, when a signal is input to a control signal input terminal $S_1$ while a bias current is supplied to bias input terminals $B_1$ and $B_2$, the magnetic coupling Josephson gate circuits $G_1$ and $G_3$ are switched from a superconducting state to a voltage state, and the bias current is injected from an output terminal $O_1$ into the driven line L through the resistor $R_1$. The bias current flowing in the driven line L flows into ground through the magnetic coupling Josephson gate circuit $G_4$. With the above operation, an output current can be generated by the driven line L in the clockwise direction in FIG. 9.

On the other hand, when a signal is input to a control signal input terminal $S_2$, the magnetic coupling Josephson gate circuits $G_2$ and $G_4$ are switched from a superconducting state to a voltage state, and a bias current is injected from an output terminal $O_2$ into the driven line L through the resistor $R_2$. The bias current flowing in the driven line L flows into ground through the magnetic coupling Josephson gate circuit $G_3$. With the above operation, an output current can be generated by the driven line L in the counterclockwise direction in FIG. 9.

As described above, the driver circuit can realize a polarity-convertible operation capable of injecting a current into the driven line L and arbitrarily reversing the direction of the current.

In this prior art, however, since the four magnetic coupling Josephson gate circuits (two-junction SQUID gates) are used, the circuit area is increased, and large-scale integration cannot be easily performed. In addition, since control lines respectively connected to the control signal input terminals $S_1$ and $S_2$ must be magnetically coupled to the set of two magnetic coupling Josephson gate circuits $G_1$ and $G_3$ and the set of two magnetic coupling Josephson gate circuits $G_2$ and $G_4$, respectively, the inductances of the control lines are increased, and the driver circuit cannot be easily operated at high speed.

Since the magnetic coupling Josephson gate circuits are used, an input signal current relatively larger than an output current is required. Furthermore, since the inductances of the control lines are increased, the driver circuit cannot be easily operated at high speed.

SUMMARY OF THE INVENTION

It is an object of the present invention to provide a polarity-convertible Josephson driver circuit capable of micropatterning the circuit to realize large-scale integration.

It is another object of the present invention to provide a polarity-convertible Josephson driver circuit capable of obtaining a high-speed circuit operation.

It is still another object of the present invention to provide a polarity-convertible Josephson driver circuit which does not require a large input current.

In order to achieve the above objects, according to the present invention, there is provided a polarity-convertible Josephson driver circuit comprising first and second driving voltage generating circuits each having a loop circuit for forming at least one loop, the loop circuit being constituted by inductances and Josephson junctions such that a plurality of series-connected circuits each constituted by the inductances and the Josephson junctions are parallelly connected between an output point and a reference point, and a control line which has one terminal connected to an input point and the other terminal connected to the output point and is arranged to magnetically coupled to the loop circuit, a driven line for connecting the output points of the first and second driving voltage generating circuits to each other, and a load resistor inserted in the driven line.

DESCRIPTION OF THE PREFERRED EMBODIMENTS

Embodiments of the present invention will be described below with reference to the accompanying drawings.

Figure 1:
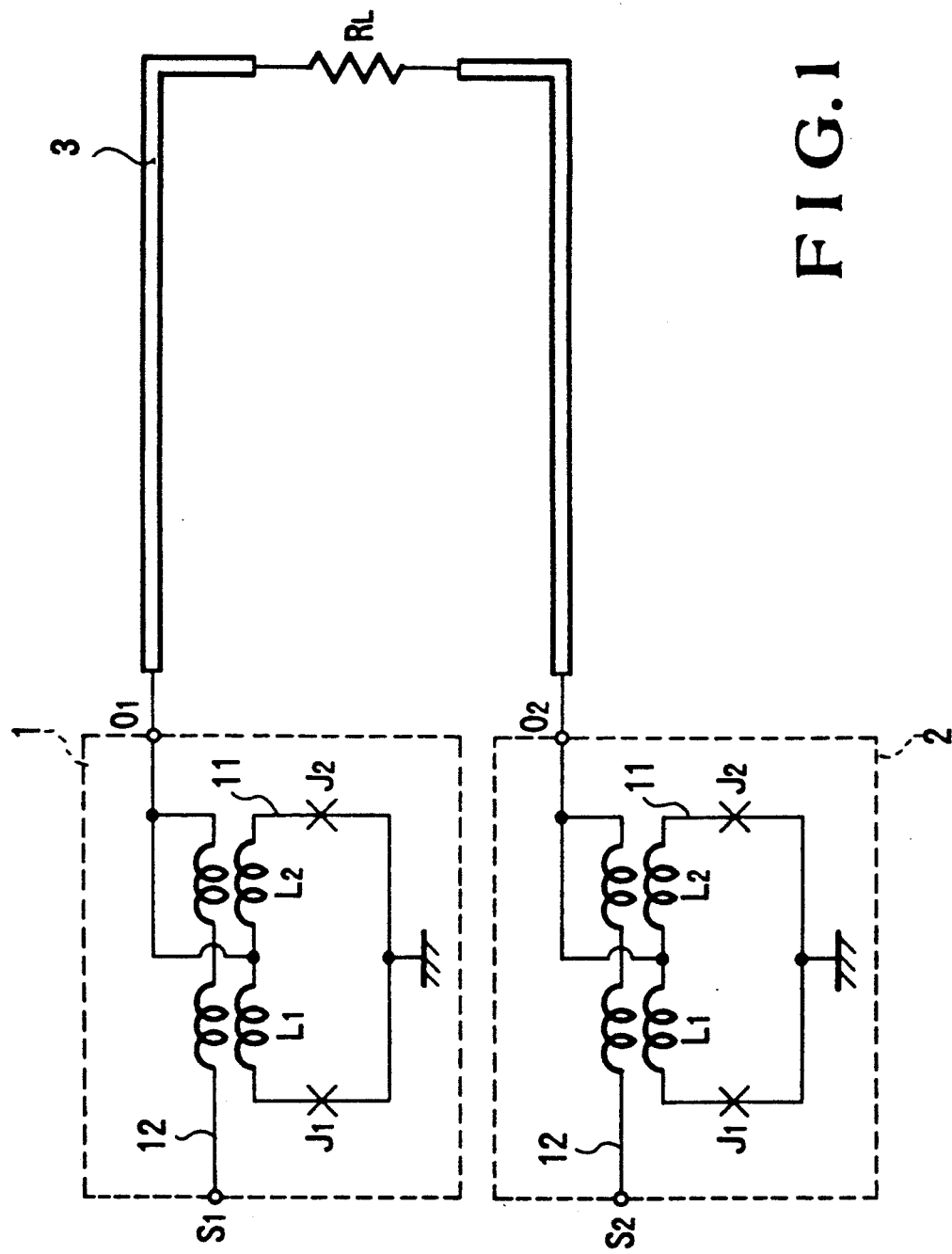
FIG. 1 is a circuit diagram showing an equivalent circuit for explaining a polarity-convertible Josephson driver circuit according to the first embodiment of the present invention.

FIG. 1 shows an equivalent circuit for explaining the first embodiment of the present invention. The first embodiment shown in FIG. 1 comprises two driving voltage generators 1 and 2, a driven line 3, and a resistor $R_L$ inserted in the driven line 3. The first and second driving voltage generators 1 and 2 have the same circuit arrangement. This arrangement is constituted by a two-junction SQUID loop 11 and one control line 12 arranged to be magnetically coupled to this loop. One terminal of the control line 12 of the first driving voltage generator 1 is connected to a control signal input terminal $S_1$, and one terminal of the control line 12 of the second driving voltage generator 2 is connected to a control signal input terminal $S_2$. The other terminal of each of the control lines 12 of the first and second driving voltage generators 1 and 2 is connected to a corresponding one of SQUID loops 11 and a corresponding one of output terminals $O_1$ and $O_2$. Each of the two-junction SQUID loops 11 is constituted by two Josephson junctions $J$ and $J_2$ and inductances $L_1$ and $L_2$. The SQUID loop 11 is formed by parallelly connecting the plurality of Josephson junctions $J_1$ and $J_2$ connected between the output terminal $O_1$ or $O_2$ and a reference point through the inductances $L_1$ and $L_2$. Elements having the same circuit constants are represented by the same reference symbols.

In order to operate the polarity-convertible Josephson driver circuit of this embodiment in a wide operating margin, the following circuit constants are determined:

$$LI_{01} = \Phi_0/4$$

$$I_{01} = I_{02} = 0.2 \text{ mA}$$

$$R_L = 8 \text{ }\Omega$$

$$I_{In} = 0.3 \text{ mA}$$

where L is the inductance of the two-junction SQUID loop 11, $\Phi_0$ is a magnetic flux quantum, $I_{01}$ and $I_{02}$ are the superconducting critical current values of the Josephson junctions $J_1$ and $J_2$, and $I_{IN}$ is a signal current value.

The operating principle of the polarity-convertible Josephson driver circuit of this embodiment is as follows. That is, when no current flows into the control line 12, the superconducting critical current value of the each of two-junction SQUID loops 11 is given by $2I_0 = 0.4$ mA. When a signal current $I_{IN}$ of 0.3 mA is input to the control signal input terminal $S_1$, the signal current is injected into the two-junction SQUID loop 11 of the driving voltage generator 1 through the control line 12. Since the control line 12 is arranged to be magnetically coupled to the two-junction SQUID loop 11, the superconducting critical current value of the two-junction SQUID loop 11 is suppressed and decreased to 0.3 mA or less.

Therefore, the two-junction SQUID loop 11 is switched from a superconducting state to a voltage state, and most of the signal current is injected from the output terminal $O_1$ into the driven line 3. The signal current flowing in the driven line 3 directly flows into the two-junction SQUID loop 11 of the driving voltage generator 2 without flowing through the control line 12. Therefore, at this time, the critical current value of the two-junction SQUID loop 11 is not suppressed, and a current of 0.3 mA or less flows into the two-junction SQUID loop 11. For this reason, the two-junction SQUID loop 11 of the driving voltage generator 2 is not switched to a voltage state, and the superconducting state of the two-junction SQUID loop 11 is maintained. With the above operation, an output current can be generated by the driven line 3 in the clockwise direction in FIG. 1.

On the other hand, when a signal current of 0.3 mA is input to the control signal input terminal $S_2$, as described above, the signal current is injected into the two-junction SQUID loop 11 of the driving voltage generator 2 through the control line. Therefore, the two-junction SQUID loop 11 is switched from a superconducting state to a voltage state, and most of the signal current is flowing in the driven line 3. The signal current injected into the driven line 3 directly flows into the two-junction SQUID loop 11 of the driving voltage generator 1 without flowing through the control line. With the above operation, an output current can be generated by the driven line 3 in the counterclockwise direction in FIG. 1.

As is apparent from the above operations, in the polarity-convertible Josephson driver circuit of this embodiment, when a current is injected from the control terminal $S_1$ or $S_2$, since the current is injected into the two-junction SQUID loop 11 while the superconducting critical current value of the two-junction SQUID loop 11 is suppressed, a corresponding one of the driving voltage generators 1 and 2 is set in a voltage state to inject the signal current into the driven line 3. On the other hand, when a current is injected into the output terminal $O_1$ or $O_2$ through the driven line 3, since the superconducting critical current value of the two-junction SQUID loop 11 is not suppressed, a corresponding one of the driving voltage generators 1 and 2 is operated to maintain its superconducting state so as to allow a polarity-converting operation.

Since the polarity-convertible Josephson driver circuit of this embodiment is formed by only two Josephson gate circuits, the circuit area of the polarity-convertible Josephson driver circuit can be considerably decreased compared with the circuit area of the conventional polarity-convertible Josephson driver circuit formed by four magnetic coupling Josephson gate circuits. Since the driver circuit of this embodiment does not require a conventional control line, having a large inductance, for supplying an input signal, the driver circuit can be operated at high speed.

In this embodiment, the two-junction SQUID loops 11 are used. However, when multi-junction SQUID loops such as three-junction SQUID loops are used, the same effect as described above can be obtained.

As described above, according to this embodiment, a polarity-convertible Josephson driver circuit having a high-speed circuit operation, a small layout area, and a high integration density can be realized.

Figure 2:
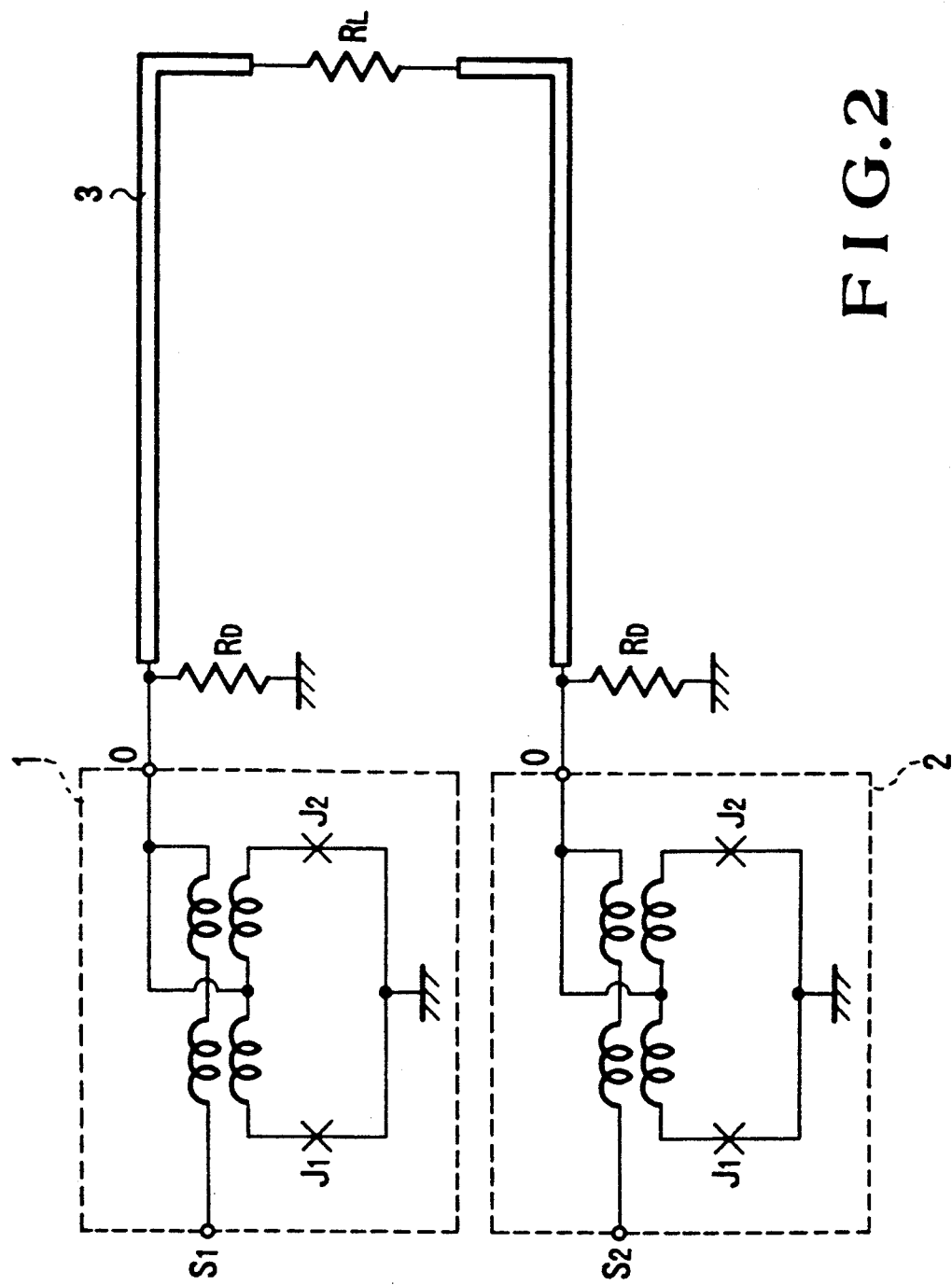
FIG. 2 is a circuit diagram showing an equivalent circuit for explaining a polarity-convertible Josephson driver circuit according to the second embodiment of the present invention.

FIG. 2 shows an equivalent circuit for explaining the second embodiment of the present invention. The embodiment shown in FIG. 2 comprises two driving voltage generators 1 and 2, a driven line 3, a load resistor $R_L$ inserted in the driven line 3, a resistor $R_D$ having one terminal grounded and the other terminal connected to one terminal of the driven line 3, and a resistor $R_D$ having one terminal grounded and the other terminal connected to the other terminal of the driven line 3. Elements having the same circuit constants are represented by the same reference symbols. The second embodiment has a circuit arrangement obtained by adding the two resistors $R_D$ to the circuit arrangement of the first embodiment.

Although the operating principle of the second embodiment is almost the same as that of the first embodiment, the operating principle of the second embodiment has the following different point. That is, when the driving voltage generators 1 and 2 are switched to a voltage state, an input signal current is shunted in inverse proportion to the values of the load resistor $R_L$ and the resistors $R_D$. Therefore, when the values of the resistors $R_D$ are properly set, a current value $I_{OUT}$ injected into the driven line 3 can be arbitrarily set with respect to an input signal current value $I_{IN}$ within a range smaller than that of the input signal current value $I_{IN}$.

When a leakage current passing through a Josephson junction which is switched to a voltage state is small and neglected, the value of each of the resistors $R_D$ can be expressed by:

$$R_D = R_L/(I_{IN}/I_{OUT} - 1)$$

For example, in order to set the value $I_{OUT}$ to be 0.3 mA when the input signal current value $I_{In}$ is set to be 0.4 mA, the value of the resistor $R_D$ is set to be 24 Ω. Other circuit constants of the second embodiment are the same as those of the first embodiment. The polarity-convertible Josephson driver circuit of the second embodiment, in addition to the effect obtained by the first embodiment, has the following effect. That is, the current value $I_{OUT}$ injected to the driven line 3 can be arbitrarily set within a range smaller than that of the input signal current value $I_{IN}$.

Figure 3:
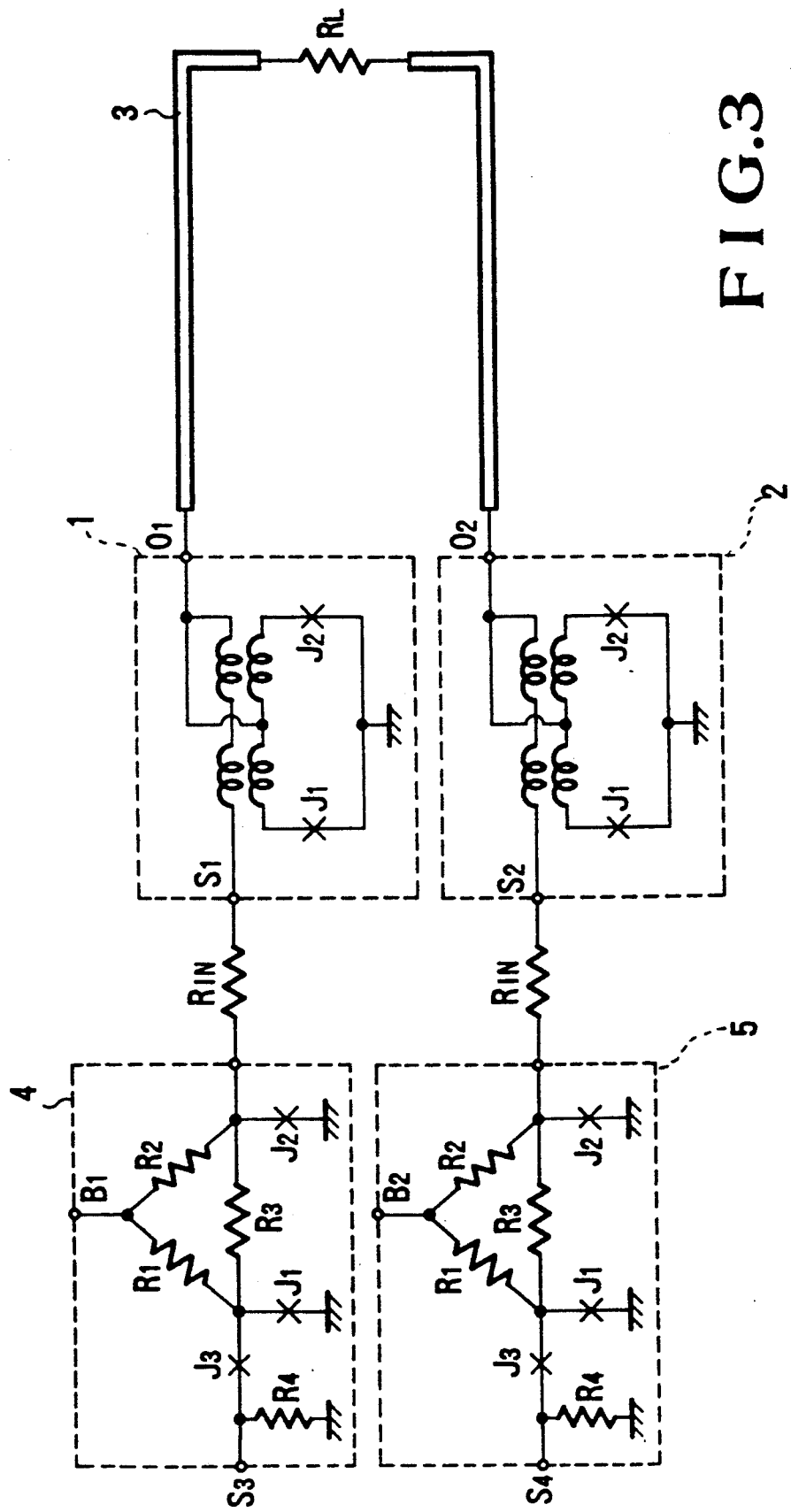
FIG. 3 is a circuit diagram showing an equivalent circuit for explaining a polarity-convertible Josephson driver circuit according to the third embodiment of the present invention.

FIG. 3 shows an equivalent circuit for explaining the third embodiment of the present invention. The embodiment shown in FIG. 3 comprises two driving voltage generators 1 and 2, a driven line 3, a load resistor $R_L$ inserted in the driven line 3, two resistive coupling Josephson logic gates (RCJL) 4 and 5, and two input resistors $R_{IN}$. The two resistive coupling Josephson logic gates 4 and 5 have the same circuit arrangement. That is, the resistive coupling Josephson logic gate 4 is constituted by three external connection terminals, i.e., a bias supply terminal $B_1$, a signal input terminal $S_1$, and an output terminal 0, three Josephson junctions $J_1$, $J_2$, and $J_3$, and four resistors $R_1$, $R_2$, $R_3$, and $R_4$. The resistive coupling Josephson logic gate 5 is constituted by three external connection terminals, i.e., a bias supply terminal $B_2$, a signal input terminal $S_2$, and an output terminal $O_2$, three Josephson junctions $J_1$, $J_2$, and $J_3$, and four resistors $R_1$, $R_2$, $R_3$, and $R_4$. Elements having the same circuit constants are represented by the same reference symbols. The circuit arrangement of the third embodiment is obtained by adding the two resistive coupling Josephson logic gates 4 and 5 each having an input/output separating function to the circuit arrangement of the first embodiment.

Although the operating principle of the third embodiment is almost equal to that of the first embodiment, the operating principle of the third embodiment has the following different point. That is, input/output separation is performed by the resistive coupling Josephson logic gates 4 and 5 so that input signal current values to the driving voltage generators 1 and 2 are set to be arbitrary constant values. Therefore, a current value $I_{OUT}$ injected into the driven line 3 can be arbitrarily set. This is very effective in a case wherein an input signal to the polarity-convertible Josephson driver circuit is changed.

For example, even when the input signal is changed from 0.1 mA to 1 mA, the output current value $I_{OUT}$ injected into the driven line 3 can be set to be constant ($I_b = 0.32$ mA). For this reason, for example, circuit constants are preferably determined as follows:

$I_b = 0.3$ mA $I_{01} = I_{02} = I_{03} = 0.2$ mA $I_{03} = 0.133$ mA $R_1 = R_2 = R_3 = 0.75$ Ω

$R_4 = 1$ Ω

$R_L = 8$ Ω where $I_b$ is a bias current value supplied to the resistive coupling Josephson logic gates 4 and 5, $I_{01}$, $I_{02}$, and $I_{03}$ are the superconducting critical current values of the Josephson junctions $J_1$, $J_2$, and $J_3$.

The polarity-convertible Josephson driver circuit of the third embodiment, in addition to the effect obtained in the second embodiment, has the following effect. That is, the current value $I_{OUT}$ injected into the driven line 3 can be arbitrarily set by the input/output separation between an input signal and an output current. A polarity-convertible Josephson driver circuit capable of injecting a constant current to the driven line 3 independently of the value of the input signal can be realized. In the polarity-convertible Josephson driver circuit of the third embodiment, a resistive coupling Josephson logic gate (RCJL) is used as a Josephson gate circuit. However, even when a current injection gate or a magnetic coupling gate is used as the Josephson gate circuit, the same effect as described above can be obtained.

Figure 4:
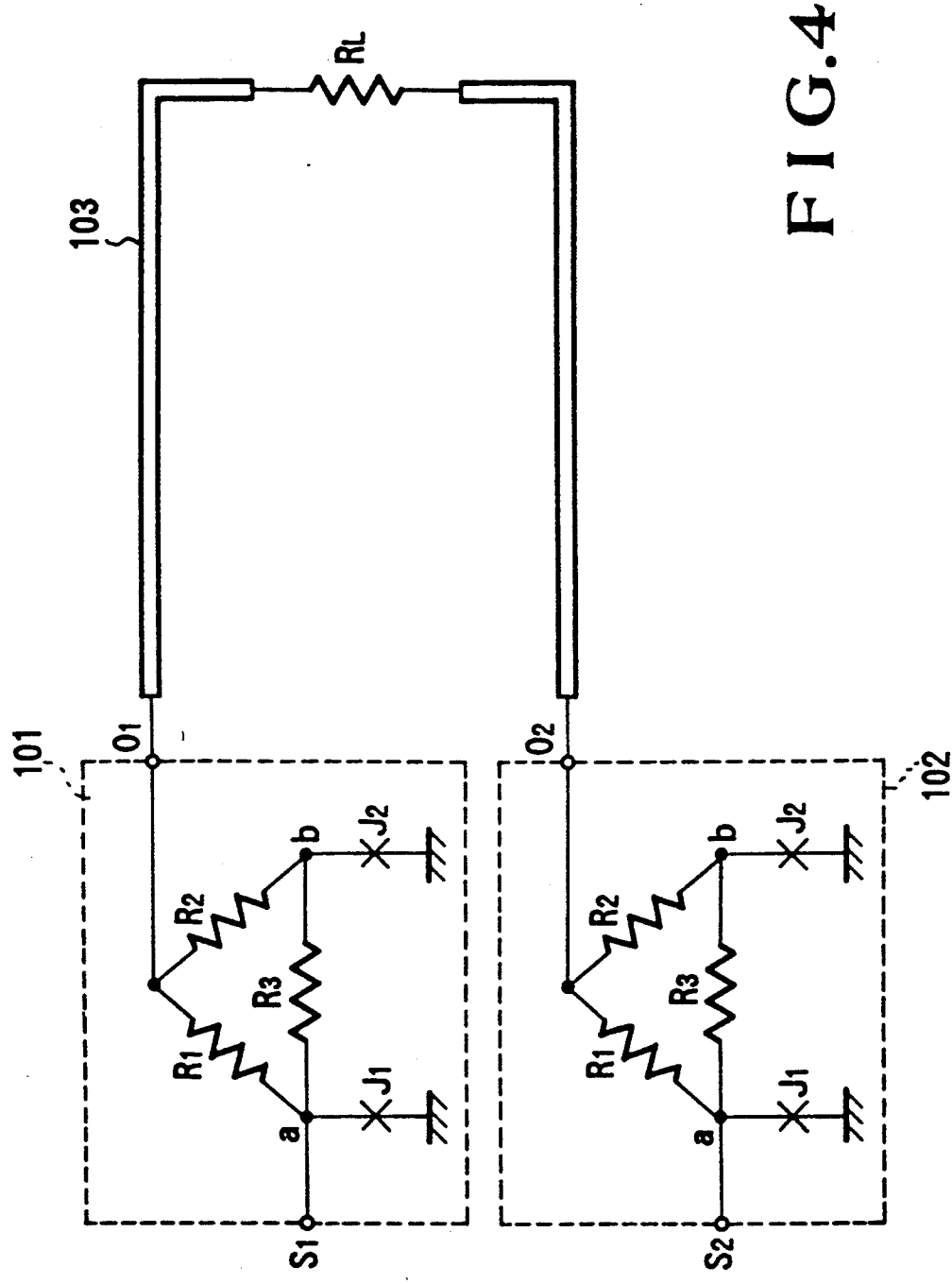
FIG. 4 is a circuit diagram showing an equivalent circuit for explaining a polarity-convertible Josephson driver circuit according to the fourth embodiment of the present invention.

FIG. 4 shows an equivalent circuit for explaining the fourth embodiment of the present invention. The embodiment shown in FIG. 4 comprises two driving voltage generators 101 and 102, a driven line 103, and a load resistor $R_L$ inserted in the driven line 103. The first and second driving voltage generators 101 and 102 have the same circuit arrangement. This arrangement is constituted by two Josephson junctions $J_1$ and $J_2$ and three resistors $R_1$, $R_2$, and $R_3$. Elements having the same circuit constants are represented by the same reference symbols.

Each of the first and second driving voltage generators 101 and 102 has the following arrangement. That is, the Josephson junctions $J_1$ and $J_2$ each having one terminal connected to a reference point are connected to a plurality of connection points a and b, respectively, and the plurality of connecting points a and b are connected to a corresponding one of output points $O_1$ and $O_2$ through resistors $R_1$ and $R_2$, respectively. In addition, two points adjacent to each other when the plurality of connection points a and b are arranged in a line are connected to each other by at least one resistor $R_3$, and one of control signal input terminals $S_1$ and $S_2$ is connected to any one of both end connection points of the plurality of connection points a and b arranged in a line.

The driven line 103 is connected between the first and second driving voltage generators 101 and 102, and the resistors $R_L$ is connected to the driven line 103.

In order to operate the polarity-convertible Josephson driver circuit of the fourth embodiment in a wide operating margin, for example, circuit constants are preferably determined as follows:

$$I_{01}=I_{02}=0.2 \text{ mA}$$

$$R_1=R_2=R_3=0.75 \text{ }\Omega$$

$$R_L=8 \text{ }\Omega$$

$$I_{IN}=0.3 \text{ mA}$$

where $I_{01}$ and $I_{02}$ are the superconducting critical current values of the Josephson junctions $J_1$ and $J_2$, and $I_{IN}$ is a signal current value.

The operating principle of the polarity-convertible Josephson driver circuit of this embodiment is as follows. That is, when a signal current of 0.3 mA is input to the control signal input terminal $S_1$, the Josephson junctions $J_1$ and $J_2$ of the driving voltage generator 101 are sequentially switched from a superconducting state to a voltage state, and most of the signal current is injected into the driven line 103. The signal current flowing in the driven line 103 is shunted and flows into the Josephson junctions $J_1$ and $J_2$ of the driving voltage generator 102.

At this time, the current flowing in the driven line 103 is 0.3 mA or less, currents each having only 0.15 mA or less flow into the Josephson junctions $J_1$ and $J_2$ of the driving voltage generator 102, respectively. For this reason, the Josephson junctions $J_1$ and $J_2$ of the driving voltage generator 102 are not switched to a voltage state. With the above operation, an output current can be generated by the driven line 103 in the clockwise direction in FIG. 4.

On the other hand, when a signal current of 0.3 mA is input to the signal input terminal $S_2$, the Josephson junctions $J_1$ and $J_2$ of the driving voltage generator 102 are switched from a superconducting state to a voltage state, and most of the signal current is injected into the driven line 103. The signal current flowing in the driven line 103 is shunted and flows into the Josephson junctions $J_1$ and $J_2$ of the driving voltage generator 101. At this time, the current flowing in the driven line 103 is 0.3 mA or less, and currents each having only 0.15 mA or less flow into the Josephson junctions $J_1$ and $J_2$ of the driving voltage generator 101, respectively. For this reason, the Josephson junctions $J_1$ and $J_2$ of the driving voltage generator 101 are not switched to a voltage state. With the above operation, an output current can be generated by the driven line 103 in the counterclockwise direction in FIG. 4.

As is apparent from the above operations, in the polarity-convertible Josephson driver circuit of the fourth embodiment, when a current is injected from the signal input terminal $S_1$ or $S_2$, since most of the input current is injected into one of the Josephson junctions $J_1$, a corresponding one of the driving voltage generators 101 and 102 is switched to a voltage state to inject the signal current into the driven line 103. On the other hand, when a current is injected into the output terminal $O_1$ or $O_2$ through the driven line, the current is shunted and flows into the two Josephson junctions $J_1$ and $J_2$, and a corresponding one of the driving voltage generators 101 and 102 is operated to maintain its superconducting state so as to allow the polarity-converting operation.

Therefore, the signal current value must be set within the following range:

$$I_{01}<I_{IN}<2I_{01}$$

an the operating margin of the signal current value is ±33% (in this case, a leakage current value passing through a Josephson junction which is switched to a voltage state is small and neglected.

Since the polarity-convertible Josephson driver circuit of the fourth embodiment is formed by only two resistive coupling Josephson gate circuits, first, the circuit area of the polarity-convertible Josephson driver circuit can be considerably decreased compared with than that of a conventional polarity-convertible Josephson driver circuit formed by four magnetic coupling Josephson gate circuits. Second, the input signal current can be considerably smaller than that of the conventional polarity-convertible Josephson driver circuit. In addition, since the driver circuit of this embodiment does not require a conventional control line, having a large inductance, for supplying an input signal, the driver circuit can be operated at high speed.

As described above, a polarity-convertible Josephson driver circuit having a high-speed circuit operation, a small layout area, and a high integration density can be realized.

Figure 5:
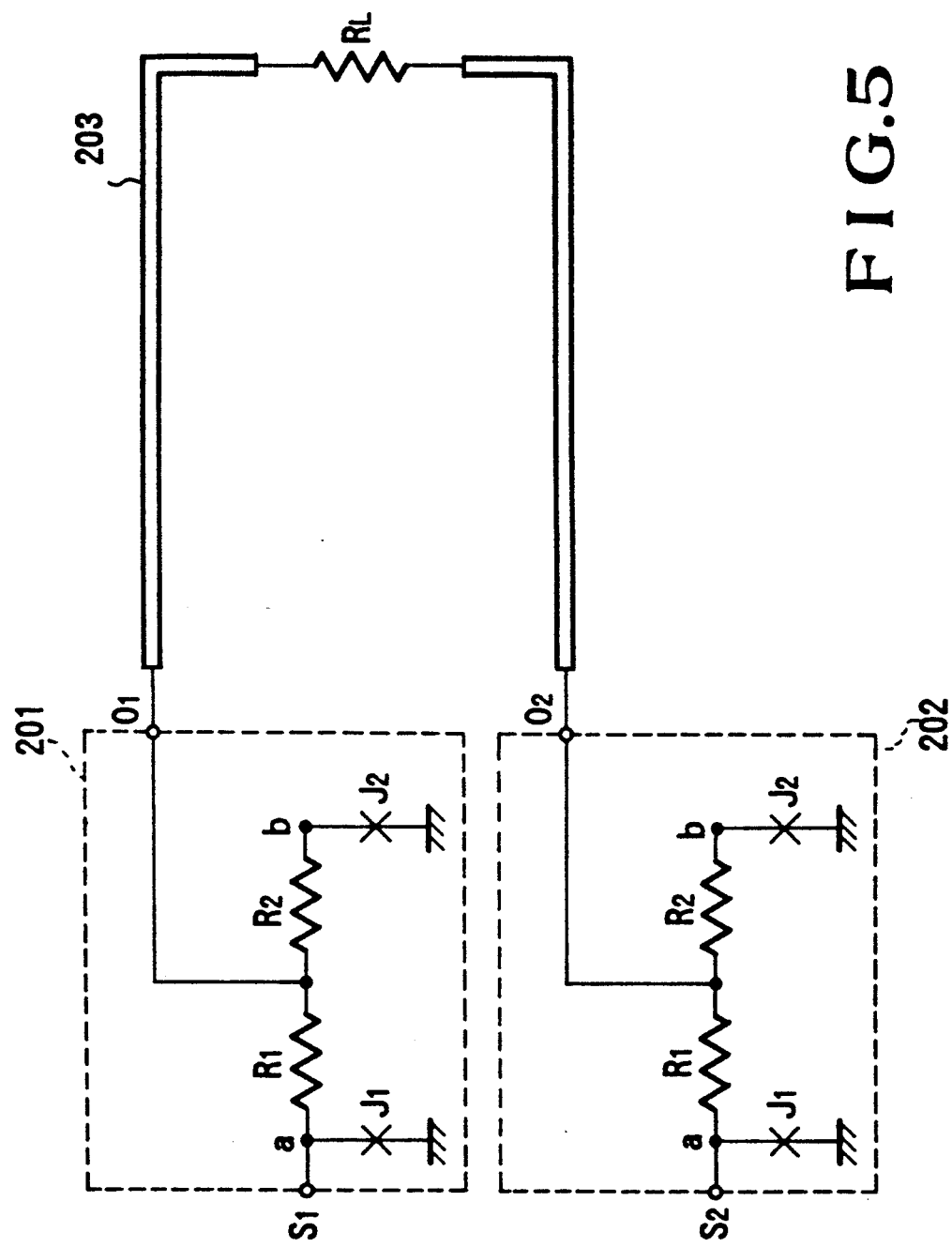
FIG. 5 is a circuit diagram showing an equivalent circuit for explaining a polarity-convertible Josephson driver circuit according to the fifth embodiment of the present invention.

FIG. 5 shows an equivalent circuit for explaining the fifth embodiment of the present invention. The embodiment shown in FIG. 5 comprises two driving voltage generators 201 and 202, a driven line 203, and a load resistor $R_L$ inserted in the driven line 203. The first and second driving voltage generators 201 and 202 having the same circuit arrangement. This arrangement is constituted by two Josephson junctions $J_1$ and $J_2$ and two resistors $R_1$ and $R_2$. Elements having the same circuit constants are represented by the same reference symbols.

In this embodiment, in each of the driving voltage generators 201 and 202, a plurality of connection points a and b are connected to a corresponding one of output points $O_1$ and $O_2$ through the resistors $R_1$ and $R_2$, and the connection points a and b are connected to each other by the resistors $R_1$ and $R_2$.

In order to operate the polarity-convertible Josephson driver circuit of the fifth embodiment in a wide operating margin, for example, circuit constants are preferably determined as follows:

$$I_{01}=I_{02}=0.2 \text{ mA}$$

$$R_1=R_2=0.5 \text{ }\Omega$$

$$R_L=8 \text{ }\Omega$$

$$I_{IN}=0.3 \text{ mA}$$

where $I_{01}$ and $I_{02}$ are the superconducting critical current values of the Josephson junctions $J_1$ and $J_2$, and $I_{IN}$ is a signal current value.

The operating principle of the polarity-convertible Josephson driver circuit of fifth embodiment is the same as that of the fourth embodiment. Since the number of resistors used in the polarity-convertible Josephson driver circuit of the fifth embodiment can be decreased by one compared with that of the fourth embodiment, the circuit area can be further decreased.

Figure 6:
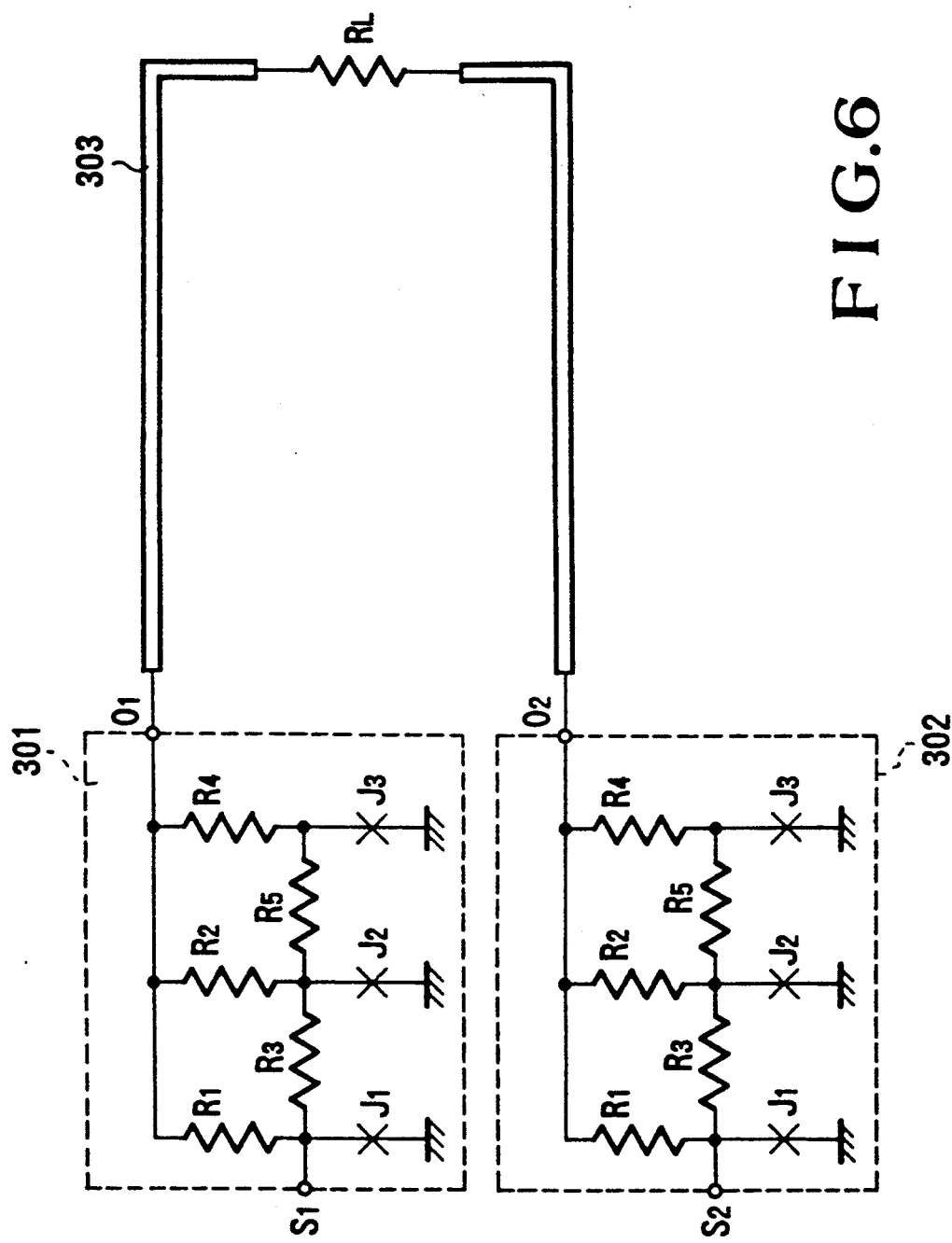
FIG. 6 is a circuit diagram showing an equivalent circuit for explaining a polarity-convertible Josephson driver circuit according to the sixth embodiment of the present invention.

FIG. 6 shows an equivalent circuit for explaining the sixth embodiment of the present invention. The embodiment shown in FIG. 6 comprises two driving voltage generators 301 and 302, a driven line 303, and a load resistor $R_L$ inserted in the driven line 303. Each of the first and second driving voltage generators 301 and 302 is constituted by three Josephson junctions, $J_1$, $J_2$, and $J_3$ and five resistors $R_1$, $R_2$, $R_3$, $R_4$, and $R_5$, and is obtained by adding the Josephson junction $J_3$ and the resistors $R_4$ and $R_5$ to the circuit shown in FIG. 4. The driving voltage generators 301 and 302 have the same circuit arrangement. Elements having the same circuit constants are represented by the same reference symbols.

In order to operate the polarity-convertible Josephson driver circuit of the sixth embodiment in a wide operating margin, for example, circuit constants are determined as follows:

$I_{01} = I_{02} = I_{03} = 0.2$ mA $R_1 = R_2 = R_3 0.2 \Omega$ $R_L = R_5 = 0.5 \Omega$ $R_L = 8 \Omega$ $I_{IN} = 0.4$ mA $I_{01}$, $I_{02}$, and $I_{03}$ are the superconducting critical current values of the Josephson junctions $J_1$, $J_2$ and $J_3$, and $I_{IN}$ in a signal current value.

The operating principle of the polarity-convertible Josephson driver circuit of this embodiment is as follows. That is, when a signal current of 0.4 mA is input to a control signal input terminal $S_1$, the Josephson junctions $J_1$, $J_2$, and $J_3$ of the driving voltage generator 301 are sequentially switched from a superconducting state to a voltage state, most of the signal current is injected into the driven line 303. The signal current flowing in the driven line 303 is shunted and flows into the Josephson junctions $J_1$, $J_2$, and $J_3$ of the driving voltage generator 302.

At this time, the current flowing in the driven line 303 is 0.4 mA or less, currents each having only 0.13 mA or less flow into the Josephson junctions $J_1$, $J_2$, and $J_3$ of the driving voltage generator 302, respectively. For this reason, the Josephson junctions $J_1$, $J_2$, $J_3$ of the driving voltage generator 302 are not switched to a voltage state. With the above operation, an output current can be generated by the driven line 303 in the clockwise direction in FIG. 6.

On the other hand, when a signal current of 0.4 mA is input to a control signal input terminal $S_2$, the Josephson junctions $J_1$, $J_2$, and $J_3$ of the driving voltage generator 302 are switched from a superconducting state to a voltage state, and most of the signal current is injected into the driven line 303. The signal current injected into the driven line 303 is shunted and flows into the Josephson junctions $J_1$, $J_2$, and $J_3$ of the driving voltage generator 301. At this time, the current flowing in the driven line 303 is 0.4 mA or less, and currents each having only 0.13 mA or less flow into the Josephson junctions $J_1$, $J_2$, and $J_3$ of the driving voltage generator 301, respectively. For this reason, the Josephson junctions $J_1$, $J_2$, $J_3$ of the driving voltage generator 301 are not switched to a voltage state. With the above operation, an output current can be generated by the driven line 303 in the counterclockwise direction in FIG. 6.

As is apparent from the above operations, in the polarity-convertible Josephson driver circuit of the sixth embodiment, when a current is injected from the signal input terminal $S_1$ or $S_2$, since most of the input current is injected into one of the Josephson junctions $J_1$, a corresponding one of the driving voltage generators 301 and 302 is switched to a voltage state to inject the signal current into the driven line 303. On the other hand, when a current is injected into output terminal $O_1$ or $O_2$ through the driven line 303, the current is shunted and flows into the three Josephson junctions $J_1$, $J_2$, and $J_3$ of the corresponding one of the driving voltage generators 301 and 302, and the corresponding one of the driving voltage generators 301 and 302 is operated to maintain its superconducting state so as to allow a polarity-converting operation.

Therefore, the signal current value must be set within the following range:

$L_{01} < I_{IN} < 3I_{01}$ and the operating margin of the signal current value is ±50% (in this case, a leakage current value passing through a Josephson junction which is switched to a voltage state is small and neglected).

The polarity-convertible Josephson driver circuit of the sixth embodiment has, in addition to the effect obtained in the fourth embodiment, an effect of obtaining an operating margin of a larger signal current value.

Figure 7:
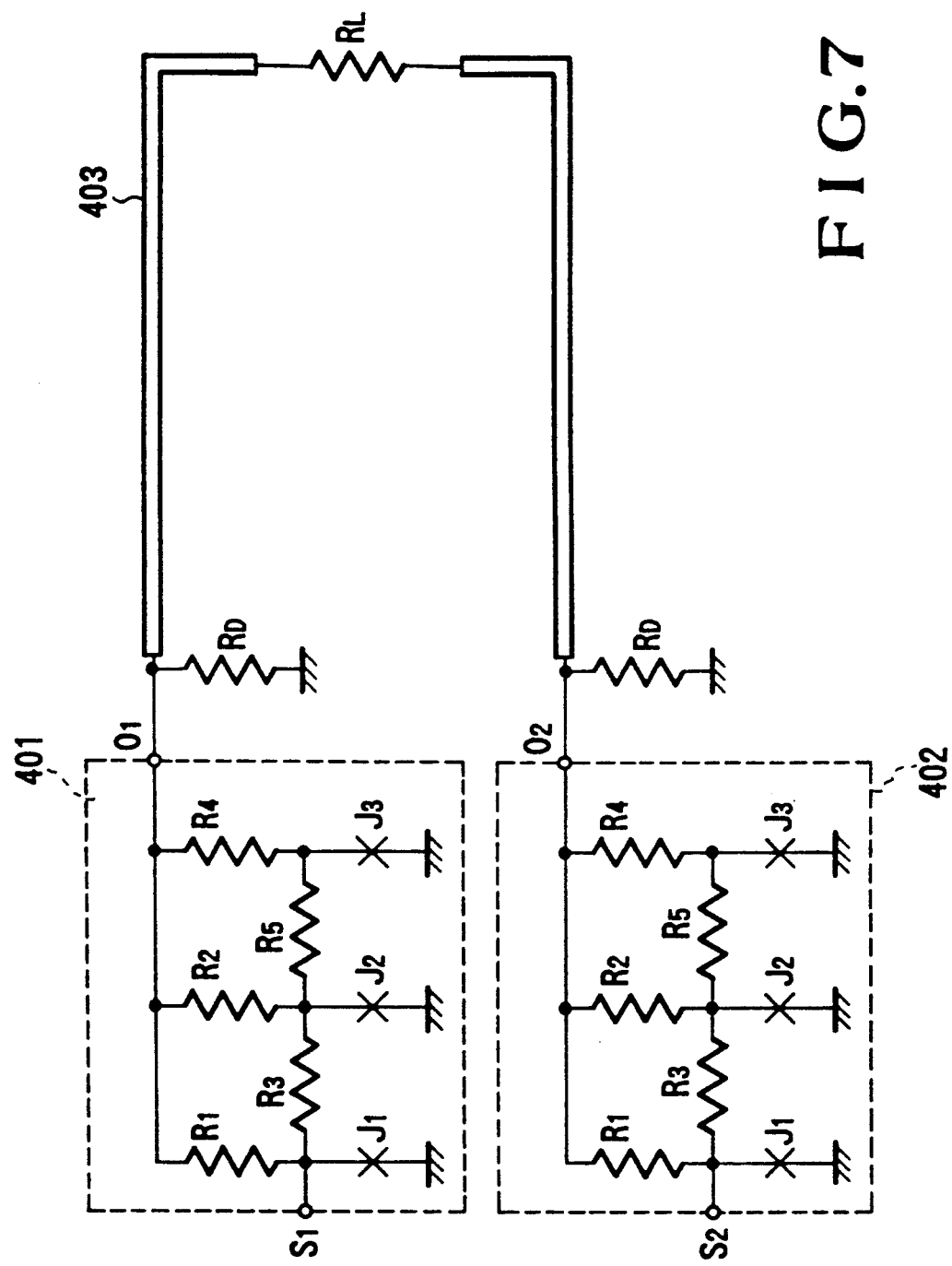
FIG. 7 is a circuit diagram showing an equivalent circuit for explaining a polarity-convertible Josephson driver circuit according to the seventh embodiment of the present invention.

FIG. 7 shows an equivalent circuit for explaining the seventh embodiment of the present invention. The embodiment shown in FIG. 7 comprises two driving voltage generators 401 and 402, a driven line 403, a load resistor $R_L$ inserted in the driven line 403, a resistor $R_D$ having one terminal grounded and the other terminal connected to one terminal of the driven line 403, and a resistor $R_D$ having one terminal grounded and the other terminal connected to the other terminal of the driven line 403. The first and second driving voltage generators 401 and 402 have the same circuit arrangement. This arrangement is constituted by three Josephson junctions $J_1$, $J_2$, and $J_3$ and five resistors $R_1$, $R_2$, $R_3$, $R_4$, and $R_5$. Elements having the same circuit constants are represented by the same reference symbols. The seventh embodiment has a circuit arrangement obtained by adding the two resistors $R_D$ to that of the sixth embodiment.

Although the operating principle of the seventh embodiment is almost equal to that of the sixth embodiment, the operating principle of the seventh embodiment has the following different point. That is, when each of the driving voltage generators is switched to a voltage state, an input signal current is shunted in inverse proportion to the values of the load resistor $R_L$ and the resistor $R_D$. Therefore, the values of the resistors $R_D$ are properly set, a current value $I_{OUT}$ injected into the driven line 403 can be arbitrarily set with respect to an input signal current value $I_{IN}$ within a range smaller than that of the input signal current value $I_{IN}$. When the leakage current passing through a Josephson junction which is switched to a voltage state is small and neglected, the value of each of the resistors $R_D$ can be expressed by:

$R_D = R_L/(I_{IN}/I_{OUT} - 1)$

For example, in order to set the value $I_{OUT}$ to be 0.3 mA when the input signal current value $I_{IN}$ is set to be 0.4 mA, circuit constants can be determined as follows:

$R_D = 24 \, \Omega$ $I_{01} = I_{02} = I_{03} = 0.2 \, mA$ $R_1 = R_2 = R_3 = 2 \, \Omega$ $R_L = R_5 = 0.5 \, \Omega$ $R_L = 8 \, \Omega$ where $I_{01}$, $I_{02}$, and $I_{03}$ are the superconducting critical current values of the Josephson junctions $J_1$, $J_2$ and $J_3$.

The polarity-convertible Josephson driver circuit of the seventh embodiment, in addition to the effect obtained by the sixth embodiment, has the following effect. That is, the current value $I_{OUT}$ injected into the driven line 403 can be arbitrarily set within a range smaller than that of the input signal current value $I_{IN}$.

Figure 8:
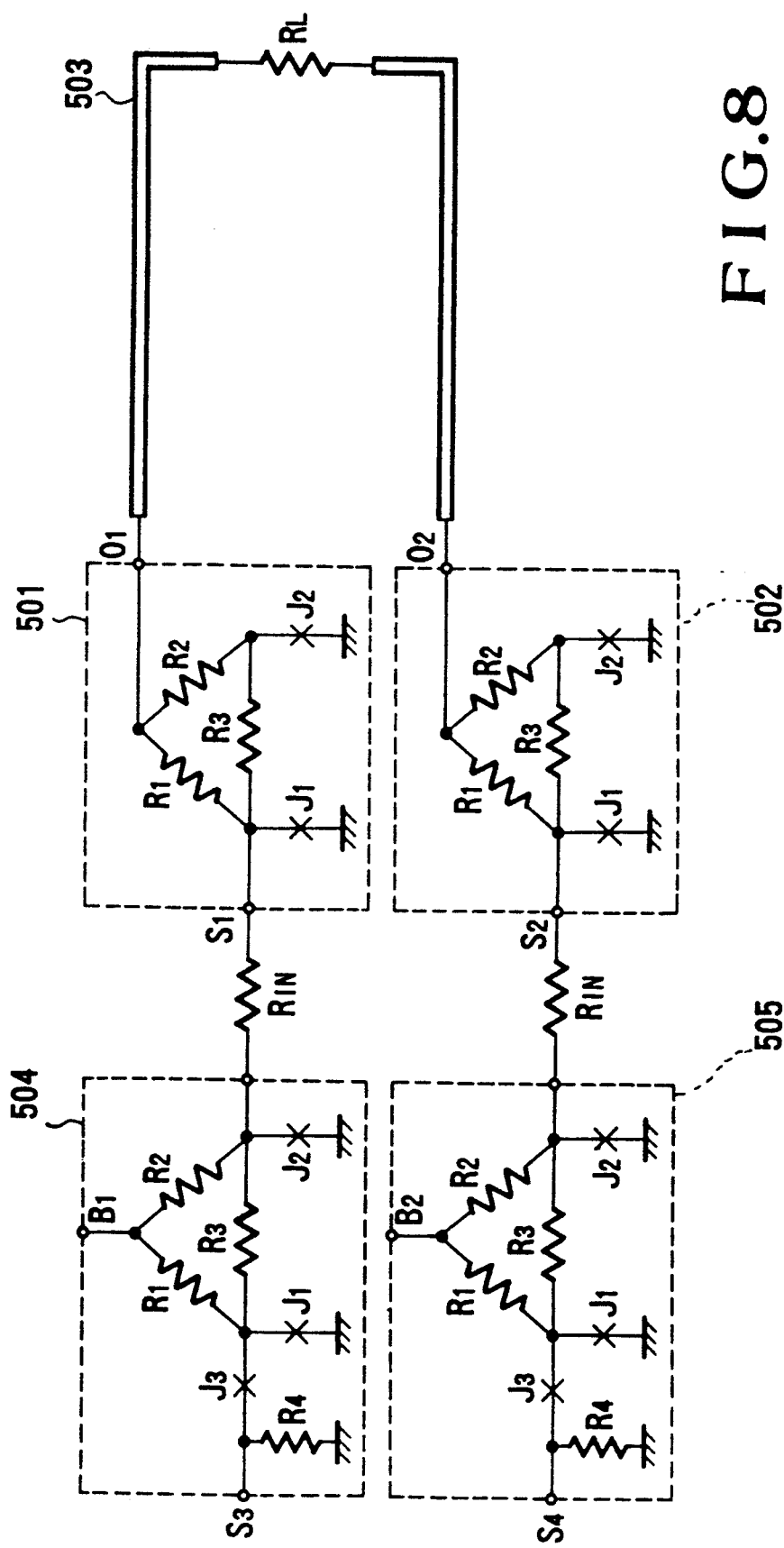
FIG. 8 is a circuit diagram showing an equivalent circuit for explaining a polarity-convertible Josephson driver circuit according to the eighth embodiment of the present invention.
Figure 9:
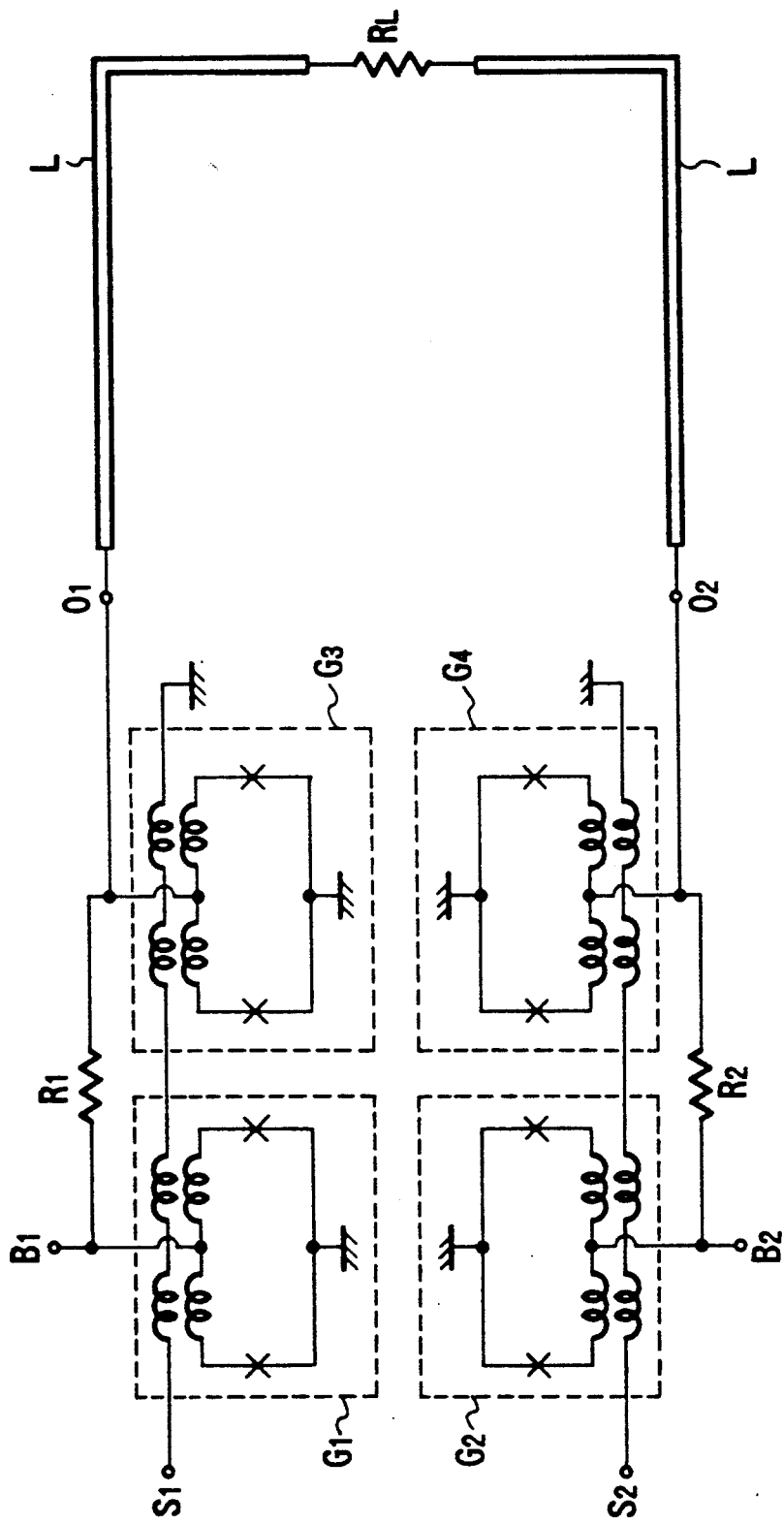
FIG. 9 is a circuit diagram showing an equivalent circuit for explaining a conventional polarity-convertible Josephson driver circuit.

FIG. 8 shows an equivalent circuit for explaining the eighth embodiment of the present invention. The embodiment shown in FIG. 8 comprises tow driving voltage generators 501 and 502, a driven line 503, a load resistor $R_L$ inserted in the driven line 503, two resistive coupling Josephson logic gates (RCJL) 504 and 505, and two input resistors $R_{IN}$. The driving voltage generators 501 and 502 have the same circuit arrangement. This arrangement is constituted by two Josephson junctions $J_1$ and $J_2$ and three resistors $R_1$, $R_2$, and $R_3$.

The two resistive coupling Josephson logic gates 504 and 505 have the same circuit arrangement. This arrangement is constituted by the connection terminals for external circuits, i.e., a bias supply terminal B, signal input terminals S, and an output terminal O, three Josephson junctions $J_1$, $J_2$, and $J_3$, and four resistors $R_1$, $R_2$, $R_3$, and $R_4$. Elements having the same circuit constants are represented by the same reference symbols. This embodiment has a circuit arrangement obtained by adding two resistive coupling Josephson logic gates $G_{b1}$ and $G_{b2}$ each having an input/output separating function to the circuit arrangement of the first embodiment.

Although the operating principle of the eighth embodiment is almost equal to that of the fourth embodiment, the operating principle of the eighth embodiment has the following different point. That is, input/output separation is performed by the resistive coupling Josephson logic gates 504 and 505 so that input signal current values to the driving voltage generators are set to be arbitrary constant values. Therefore, a current value $I_{OUT}$ injected into the driven line 503 can be arbitrarily set. This is very effective in a case wherein an input signal to the polarity-convertible Josephson driver circuit is changed.

For example, even when the input signal is changed from 0.1 mA to 1 mA, the output current value $I_{OUT}$ injected into the driven line 503 can be set to be constant ($I_b = 0.32$ mA). For this reason, circuit constants are preferably determined as follows:

$I_b = 0.32 \, mA$ $I_{01} = I_{02} = I_{03} = 0.2 \, mA$ $I_{03} = 0.133 \, mA$ $R_1 = R_2 = R_3 = 0.75 \, \Omega$ $R_4 = 1 \, \Omega$ $R_L = 8 \, \Omega$ where $I_b$ is a bias current value supplied to each of the resistive coupling Josephson logic gates, and $I_{01}$, $I_{02}$, and $I_{03}$ are the superconducting critical current values of the Josephson junctions $J_1$, $J_2$, and $J_3$, respectively.

The polarity-convertible Josephson driver circuit of the eighth embodiment, in addition to the effect obtained by the fourth embodiment, has the following effect. That is, the current value $I_{OUT}$ injected into the driven line can be arbitrarily set by the input/output separation of an input signal and an output current.

As described above, according to the present invention, a first polarity-convertible Josephson driver circuit, having a high-speed circuit operation and an wide operating margin for a signal current value, and a high integration density obtained by decreasing a circuit area can be realized. In addition, a polarity-convertible Josephson driver circuit capable of arbitrarily setting a current value $I_{OUT}$ injected into a driven line within a range smaller than that of an input signal current $I_{IN}$ and injecting a constant output current into the driven line can be realized.

What is claimed is:

1. A polarity-convertible Josephson driver circuit comprising:
    first and second driving voltage generating circuits each having a loop circuit for forming at least one loop, said loop circuit being constituted by elements having inductances and Josephson junctions such that a plurality of series-connected circuits each constituted by said elements having inductances and said Josephson junctions are connected in parallel between an output point and a reference point, and a control line which has one terminal connected to an input point and the other terminal connected to the output point and is arranged to be magnetically coupled to said loop circuit;
    a driven line for connecting the output points of said first and second driving voltage generating circuits to each other; and
    a load resistor inserted in said driven line.

2. A circuit according to claim 1, further comprising a first resistor connected between the output point of said first driving voltage generating circuit and the reference point and a second resistor connected between the output point of said second driving voltage generating circuit and the reference point.

3. A circuit according to claim 1, further comprising first and second Josephson gate circuits each having a bias applying point, a signal input point, and an output point, a third resistor for connecting the output point of said first Josephson gate circuit to the input point of the first driving voltage generating circuit, and a fourth resistor for connecting the output point of said second Josephson gate circuit to the input point of said second driving voltage generating circuit.

4. A polarity-convertible Josephson driver circuit comprising:
    first and second driving voltage generating circuits each of which is arranged such that Josephson junctions are connected between a reference point and each of connection points connected to an output point through a first resistor, respectively, two adjacent points of the connection points are connected in series with each other through at least a second resistor, one of end connecting points of the series-connected connection points is connected to an input point;

a driven line for connecting the output points of said first and second driving voltage generating circuits to each other; and a load resistor inserted in said driven line.

5. A circuit according to claim 4, further comprising third and fourth resistors connected between the reference point and the output points of said first and second driving voltage generating circuits, respectively.

6. A circuit according to claim 4, further comprising first and second Josephson gate circuits each having a bias applying point, a signal input point, and an output point, a fourth resistor for connecting the output point of said first Josephson gate circuit to the input point of said first driving voltage generating circuit, and a fifth resistor for connecting the output point of said second Josephson gate circuit to the input point of said second driving voltage generating circuit.

* * * * *

UNITED STATES PATENT AND TRADEMARK OFFICE
CERTIFICATE OF CORRECTION

PATENT NO. : 5,295,093
DATED : March 15, 1994
INVENTOR(S) : Shuichi NAGASAWA

It is certified that error appears in the above-identified patent and that said Letters Patent is hereby corrected as shown below:

Col. 3, line 37, delte "$II_{01}$" and insert $LI_{01}$--.

Col. 11, line 24, delete "tow" and insert --two--.

Signed and Sealed this

Fourth Day of October, 1994

Attest:

BRUCE LEHMAN

Attesting Officer          Commissioner of Patents and Trademarks